United States Patent
Fujiwara et al.

(10) Patent No.: US 10,914,799 B2
(45) Date of Patent: Feb. 9, 2021

(54) NMR SAMPLE TUBE

(71) Applicants: Osaka University, Suita (JP); JEOL Ltd., Tokyo (JP)

(72) Inventors: Toshimichi Fujiwara, Suita (JP); Yoh Matsuki, Suita (JP); Yuki Endo, Tokyo (JP); Takahiro Nemoto, Tokyo (JP); Shinji Nakamura, Tokyo (JP)

(73) Assignees: JEOL Ltd., Tokyo (JP); Osaka University, Osaka (JP)

(*) Notice: Subject to any disclaimer, the term of this patent is extended or adjusted under 35 U.S.C. 154(b) by 0 days.

(21) Appl. No.: 16/364,793

(22) Filed: Mar. 26, 2019

(65) Prior Publication Data
US 2019/0324099 A1    Oct. 24, 2019

(30) Foreign Application Priority Data
Apr. 20, 2018 (JP) ................................ 2018-081242

(51) Int. Cl.
*G01R 33/30* (2006.01)
(52) U.S. Cl.
CPC ................... *G01R 33/307* (2013.01)
(58) Field of Classification Search
CPC ............... G01R 33/307; G01R 33/30
USPC ............................................. 324/321
See application file for complete search history.

(56) References Cited

U.S. PATENT DOCUMENTS

| 4,963,210 A * | 10/1990 | Corr ............... G01B 1/00 138/109 |
| 5,462,791 A | 10/1995 | Kashima et al. |
| 6,310,480 B1 | 10/2001 | Cohen et al. |
| 2008/0088312 A1 | 4/2008 | Spraul et al. |
| 2016/0223628 A1 | 8/2016 | Fujiwara et al. |

FOREIGN PATENT DOCUMENTS

| DE | 102016000863 A1 | 8/2016 | |
| JP | 2002286311 A * | 10/2002 | ............... F25B 9/00 |
| JP | 2011089861 A * | 5/2011 | ............ G01R 33/30 |
| JP | 5544616 B2 | 5/2014 | |
| JP | 2016142537 A | 8/2016 | |

OTHER PUBLICATIONS

Machine Translate JP2002286311A Cryogenic Refrigerating Machine (Year: 2002).*
Machine Translate JP2011089861A (Year: 2011).*
Extended European Search Report issued in EP19165253.6 dated Sep. 27, 2019.

* cited by examiner

*Primary Examiner* — Farhana A Hoque
*Assistant Examiner* — Courtney G McDonnough
(74) *Attorney, Agent, or Firm* — The Webb Law Firm (57) ABSTRACT

A rotor contains a sample. A turbine cap is fitted into an opening of one end of the rotor, and a bottom cap is fitted into an opening of the other end of the rotor. A recess portion is formed in the turbine cap, and a recess portion is formed in the bottom cap. Insert members having a negative linear expansion coefficient are disposed in the recess portions.

5 Claims, 7 Drawing Sheets

NMR SAMPLE TUBE

CROSS-REFERENCE TO RELATED APPLICATION

This application claims priority to Japanese Patent Application No. 2018-081242 filed Apr. 20, 2018, the disclosure of which is hereby incorporated by reference in its entirety.

BACKGROUND OF THE INVENTION

Field of the Invention

The present disclosure relates to a sample tube for use in nuclear magnetic resonance (NMR) measurement.

Description of Related Art

As a magnetic resonance measurement device, a nuclear magnetic resonance (NMR) spectrometer is known. NMR is a phenomenon in which an atomic nucleus placed in a static magnetic field interacts with an electromagnetic wave having a unique frequency. The NMR spectrometer is a device that performs measurement of a sample at an atomic level by use of this phenomenon.

In NMR measurement on a solid sample, a magic angle spinning (MAS) method is usually employed. In the MAS method, a sample tube containing the solid sample is spun at a high speed while tilting at a predetermined angle (the magic angle, 54.7 degrees in general) to a static magnetic field direction. In this state, a high frequency magnetic field is generated by a transmitting and receiving coil that surrounds the sample tube, and an NMR signal is detected by the transmitting and receiving coil.

The above described sample tube generally includes a rotor and two caps. The rotor is a member that constitutes a main body of the sample tube, and this member has a cylindrical shape and contains a sample. One of the caps is a member fitted into one end of the rotor to close the one end, and having a function of a turbine. The other cap is a member fitted into the other end of the rotor to close the other end, and having a function of a thrust bearing. When a gas for the bearing is supplied to the sample tube, the sample tube is held by a gas bearing, and further when a gas for spinning control is supplied to the sample tube, the sample tube is spun at the high speed.

In general, each cap is a member that is attachable to and detachable from the rotor. In a state where the cap is removed from the rotor, the sample is charged into the rotor or the sample is taken out from the rotor.

In JP5544616B, a seal stopper in which a hard core is inserted is described as a configuration to increase a sealing force between a sample tube main body and the seal stopper.

Additionally, since the cap is the member that functions as the gas bearing, particularly precise processing is required. To meet this requirement, it is conceivable to employ engineering plastic having excellent strength as a material of the cap. The use of, for example, polyimide, fluorine resin or polyether ether ketone is conceivable. In general, ceramics are used as a material of the rotor. The above materials have positive linear expansion coefficients that are about one order of magnitude higher than a linear expansion coefficient of the ceramics. Consequently, when the rotor or the cap contracts in accordance with temperature drop of the sample tube, the cap may fall out from the rotor.

To prevent the cap from falling outside, it is conceivable that a diameter of a fitting portion of the cap (i.e., a diameter of the portion of the cap which is to be fitted into the rotor) is increased by taking thermal contraction of the cap into consideration beforehand, and the cap is fitted into the rotor. However, in this case, the cap is irreversibly deformed, and a restoration force of the cap is lost. Consequently, it is difficult to prevent the cap from falling outside. Furthermore, a larger force is required to attach and detach the cap having a larger cap diameter, and hence the cap has poor reusability.

Alternatively, it is conceivable to employ fiber-reinforced plastic as the material of the cap. It is also conceivable that the cap can be prevented from falling outside, because the fiber-reinforced plastic has a linear expansion coefficient that is smaller than a linear expansion coefficient of the engineering plastic. However, it is difficult to precisely process the fiber-reinforced plastic and to prepare the cap that functions as the gas bearing. Therefore, it is not realistic to use the fiber-reinforced plastic as the material of the cap. Furthermore, a modulus of elasticity of the fiber-reinforced plastic is very large, and hence a large force is required to fit the cap made of the fiber-reinforced plastic into the rotor. Therefore, this cap has poorer reusability than does the cap made of the engineering plastic.

An object of the present disclosure is to provide a sample tube for use in NMR measurement, in which a cap fitted into a main body of the sample tube is prevented from falling outside in accordance with temperature drop of the sample tube.

SUMMARY OF THE INVENTION

One aspect of the present disclosure is an NMR sample tube in which a sample of a target of NMR measurement is contained and which is rotated during the measurement, the NMR sample tube including a main body having a tubular shape in which at least one end is opened, and containing the sample; a cap fitted into an opening of the end of the main body to close the opening of the end; and an insert member disposed in the cap and having a negative linear expansion coefficient.

According to the above configuration, since the insert member has the negative linear expansion coefficient, the insert member expands in the cap in accordance with temperature drop. The cap contracts in accordance with the temperature drop, but the insert member expands, so that the contraction of the cap is inhibited. In consequence, the cap fitted into the main body of the sample tube is unlikely to fall out from the main body, and the cap may be prevented from falling outside in accordance with the temperature drop. As a result, the NMR measurement may be performed at a temperature that is lower than a temperature at which the measurement is performed without using any insert members. In consequence, according to the above configuration, a range of the measurement temperature may be enlarged. In the above configuration, for example, the insert member has a linear expansion coefficient that is smaller than a linear expansion coefficient of the main body. As an example, the insert member has the negative linear expansion coefficient. When the main body contracts more than the cap in accordance with the temperature drop, the cap is unlikely to fall out from the main body, and the cap may be prevented from falling outside.

The insert member may be made of a fiber material coated with a resin.

According to the above configuration, even when a sample having properties of a liquid is contained in the NMR sample tube, liquid absorption by the insert member may be prevented.

The insert member may be disposed in the cap so that the insert member expands toward an inner surface of the main body in accordance with temperature drop.

According to the above configuration, even when the cap contracts in a direction away from the inner surface of the main body, the contraction of the cap is inhibited by the insert member. As a result, the cap may be prevented from falling out from the main body.

The main body may have a cylindrical shape, and the insert member may be a member formed by winding fibers having a negative linear expansion coefficient in a fiber direction in the form of a pillar along a circumferential direction of the main body.

At least a part of a surface of the cap which faces an inner surface of the main body may have a shape that protrudes toward the inner surface of the main body, and the insert member may be disposed at a position corresponding to at least the protruding portion in the cap.

The cap has, for example, a positive linear expansion coefficient.

According to the present disclosure, in the sample tube for use in the NMR measurement, the cap fitted into the main body of the sample tube may be prevented from falling out from the main body in accordance with the temperature drop of the sample tube.

BRIEF DESCRIPTION OF THE DRAWINGS

Embodiments of the present disclosure will be described by reference to the following figures, wherein.

DESCRIPTION OF THE INVENTION

First Embodiment

Figure 1:
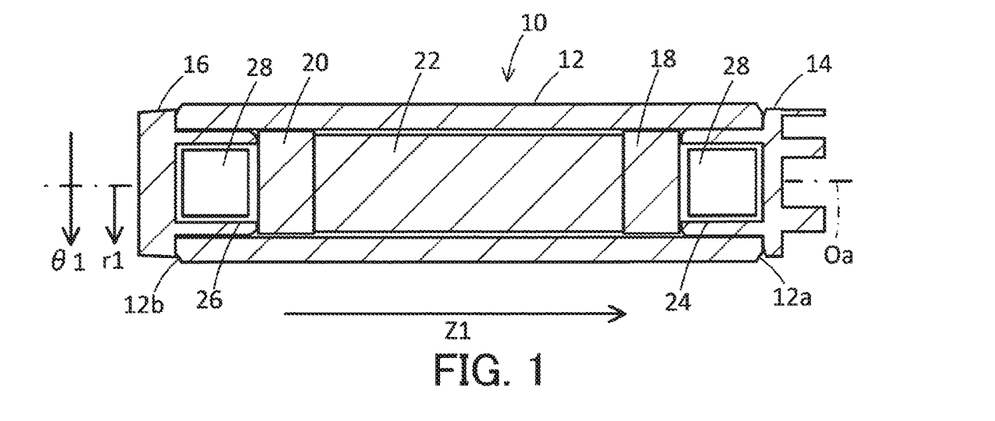
FIG. 1 is a sectional view showing an NMR sample tube according to a first embodiment.

Description will be made as to an NMR sample tube according to a first embodiment with reference to FIG. 1. FIG. 1 is a sectional view showing an example of the NMR sample tube according to the first embodiment. An NMR sample tube 10 is a sample tube for use in NMR measurement, and the tube is rotated about a rotation axis Oa during the NMR measurement.

The NMR sample tube 10 includes a rotor 12 as a main body of the sample tube, a turbine cap 14, and a bottom cap 16. The rotor 12 is a member having a cylindrical shape and containing a sample therein. The rotor 12 constitutes a shaft portion of a radial bearing. One end 12a and the other end 12b of the rotor 12 are open. The rotor 12 is a member made of, for example, ceramics or single crystal sapphire and having a positive linear expansion coefficient. Therefore, the rotor 12 contracts in accordance with temperature drop. As ceramics, for example, zirconia or silicon nitride is used. A linear expansion coefficient ($\times 10^{-6}/°$ C.) of zirconia is 10.5, and a linear expansion coefficient of silicon nitride is 2.4. Furthermore, a linear expansion coefficient of single crystal sapphire is from 7.0 to 7.7.

The turbine cap 14 is fitted into the one end 12a of the rotor 12. Consequently, an opening of the one end 12a is closed by the turbine cap 14. That is, no gap is present between an inner peripheral surface of the rotor 12 and the turbine cap 14 in the one end 12a, and the turbine cap 14 is inserted in the one end 12a. An impeller is formed in the turbine cap 14. A jet stream is blown against a plurality of blades that constitute the impeller, to generate an impellent force to drive the NMR sample tube 10, so that the NMR sample tube 10 is rotated. Thus, the turbine cap 14 functions as a turbine.

The bottom cap 16 is fitted into the other end 12b of the rotor 12. Consequently, an opening of the other end 12b is closed by the bottom cap 16. That is, no gap is present between the inner peripheral surface of the rotor 12 and the bottom cap 16 in the other end 12b, and the bottom cap 16 is inserted in the other end 12b. The bottom cap 16 functions as a thrust bearing.

The turbine cap 14 and the bottom cap 16 are members made of, for example, a resin and having the positive linear expansion coefficient. Therefore, the turbine cap 14 and the bottom cap 16 contract in accordance with the temperature drop. As the resin, for example, polyether ether ketone resin (PEEK) is used. A linear expansion coefficient ($\times 10^{-6}/°$ C.) of the PEEK is 50. Needless to say, a resin other than this resin may be used.

Furthermore, spacers 18 and 20 are provided in the rotor 12. The spacers 18 and 20 are members to limit a region where the sample is contained in the rotor 12. The spacers 18 and 20 are disposed away from each other, and a sample 22 is contained in the region formed between the spacer 18 and the spacer 20. The sample 22 is, for example, a solid sample. Needless to say, the sample 22 may be a solution sample. The spacers 18 and 20 are made of, for example, a resin. Note that the spacers 18 and 20 do not have to be provided. In this case, the sample 22 is contained in the region formed between the turbine cap 14 and the bottom cap 16 in the rotor 12.

Furthermore, a recess portion 24 is formed in a portion of the turbine cap 14 which is to be fitted (a portion to be inserted) into the rotor 12; that is, on an inner side of the turbine cap 14. Similarly, a recess portion 26 is formed in a portion of the bottom cap 16 which is to be fitted (a portion to be inserted) into the rotor 12; that is, on an inner side of the bottom cap 16. The recess portions 24 and 26 have, for example, a cylindrical shape. Needless to say, the recess portions 24 and 26 may have a rectangular shape. The recess portions 24 and 26 are formed, for example, by spot facing. Needless to say, the recess portions 24 and 26 may be formed by a technique other than the spot facing.

Insert members 28 are arranged in the recess portions 24 and 26, respectively. The insert members 28 are made of, for example, a resin and have a negative linear expansion coefficient. As a material of the insert members 28, for example, high-density polyethylene fibers (e.g., Dyneema (registered trademark)), polyacrylate fibers (e.g., Vectran (registered trademark)), aramid fibers (e.g., Kevlar (registered trademark)), or the like are used. These fiber materials have the negative linear expansion coefficient in a fiber direction. The linear expansion coefficient ($\times 10^{-6}/°$ C.) of Dyneema is −12, and the linear expansion coefficient of Kevlar is −4. This fiber material is wound to form each insert member 28. The insert member 28 formed in this manner has properties to expand in the fiber direction in accordance with the temperature drop. For example, an orientation of each insert member 28 is determined so that the insert member 28 expands toward the inner peripheral surface of the rotor 12 in accordance with the temperature drop, and the insert members 28 are arranged in the recess portions 24 and 26, respectively.

A size and shape of the insert members 28 are determined so that the insert members 28 come in contact with inner peripheral surfaces of the recess portions 24 and 26, when the turbine cap 14 and the bottom cap 16 contract and the insert members 28 expand in the fiber direction in accordance with the temperature drop. In the example shown in FIG. 1, a slight gap is formed between the insert members 28 and the inner peripheral surfaces of the recess portions 24 and 26, for example, at room temperature (e.g., 300 K). The insert members 28 may come in contact with the inner peripheral surfaces of the recess portions 24 and 26 so that no gaps are formed between the insert members 28 and the inner peripheral surfaces of the recess portions 24 and 26, and the insert members 28 may partially come in contact with the inner peripheral surfaces of the recess portions 24 and 26. Even when the gap is formed, the gap is of such an extent that the insert members 28 come in contact with the inner peripheral surfaces of the recess portions 24 and 26 in accordance with the temperature drop.

The NMR sample tube 10 having the above configuration is installed in an unshown head of an NMR probe, and is inserted into a bore of a static magnetic field generation device together with the NMR probe. In the head of the NMR probe, there are installed a sample tube rotating device to rotate the NMR sample tube 10, and an NMR detection circuit including a transmitting and receiving coil. The transmitting and receiving coil is disposed to surround the rotor 12. A high frequency magnetic field is generated by the transmitting and receiving coil, and an NMR signal is detected from a nuclide as an observation target.

The NMR sample tube 10 is held by a gas bearing in the head of the NMR probe in a non-contact manner. The jet stream supplied from an unshown pump is blown against the impeller formed in the turbine cap 14, thereby rotating the NMR sample tube 10. For example, when the NMR measurement of the solid sample is performed, the rotation axis Oa of the NMR sample tube 10 is tilted with a magic angle to a static magnetic field direction, and the NMR sample tube 10 is rotated at a high speed in a state of maintaining the angle. While the NMR sample tube 10 is rotated, the high frequency magnetic field is generated by the transmitting and receiving coil, and then the NMR signal is detected by the transmitting and receiving coil in a reception period. The NMR signal is analyzed, to generate a spectrum. For example, a diameter of the rotor 12 is from several millimeters to several tens of millimeters, or 1 mm or less. The NMR sample tube 10 having such a diameter is rotated, for example, at a rotation frequency of several kilohertz to several tens of kilohertz.

In the following description, an axial direction of the rotor 12 having the cylindrical shape (i.e., the axial direction of the NMR sample tube 10) will be referred to as a Z1 direction, a circumferential direction of the rotor 12 (i.e., the circumferential direction of the NMR sample tube 10) will be referred to as a θ1 direction, and a radial direction from the rotation axis Oa of the rotor 12 (i.e., the radial direction of the NMR sample tube 10) will be referred to as an r1 direction.

Figure 2:
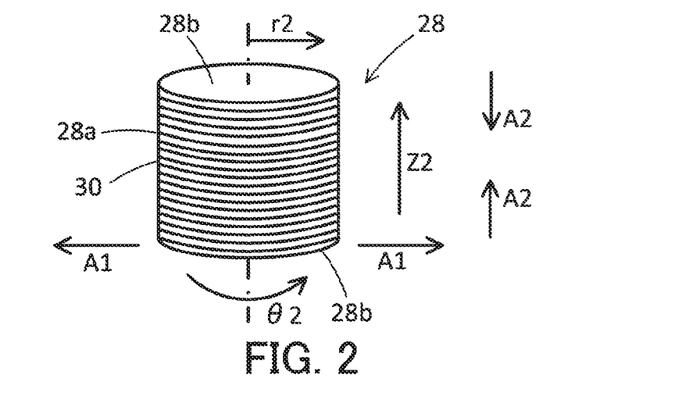
FIG. 2 is a perspective view showing an insert member.

Hereinafter, description will be made as to the insert member 28 in detail with reference to FIG. 2. FIG. 2 is a perspective view showing the insert member 28. The insert member 28 has, for example, a shape adapted to a shape of the recess portions 24 and 26. For example, when the recess portions 24 and 26 having a cylindrical shape are used, the insert members 28 have a round pillar or cylindrical shape are used. When the recess portions 24 and 26 have a rectangular shape, the insert members 28 having a rectangular shape are used. Needless to say, even when the recess portions 24 and 26 have the rectangular shape, the insert members 28 having the round pillar or cylindrical shape may be used.

Here, it is assumed that the recess portions 24 and 26 have the cylindrical shape. In this case, the insert members 28 having the round pillar or cylindrical shape are used. For example, a fiber material 30 having a negative linear expansion coefficient is wound in a round pillar shape, so that the insert member 28 having the round pillar shape is formed. The insert member 28 formed in this manner expands in a radial direction r2 of a round pillar (i.e., expands in a direction shown by arrows A1) in accordance with the temperature drop, and contracts in an axial direction Z2 of the round pillar (i.e., contracts in a direction shown by arrows A2). That is, the fiber material 30 has the property of expanding in the fiber direction in accordance with the temperature drop, and is wound in the round pillar shape along a circumferential direction θ2. Therefore, when the fiber material 30 expands in the fiber direction (i.e., in a direction in which the fiber material 30 is wound) in accordance with the temperature drop, the insert member 28 expands in the radial direction r2 and contracts in the axial direction Z2. Furthermore, in other words, the round pillar-shaped insert member 28 has a side surface 28a and bottom surfaces 28b, and the insert member 28 expands in a direction perpendicular to the side surface 28a and contracts in a direction perpendicular to each bottom surface 28b. Note that the insert member 28 may have the round pillar shape or the cylindrical shape, depending on a way to wind the fiber material 30. Alternatively, the insert member 28 does not have to have a completely round pillar or cylindrical shape. For example, slight unevenness may be formed on the surface of the insert member 28 depending on the way to wind the fiber material 30, but the insert member 28 may have such a shape.

Figure 3:
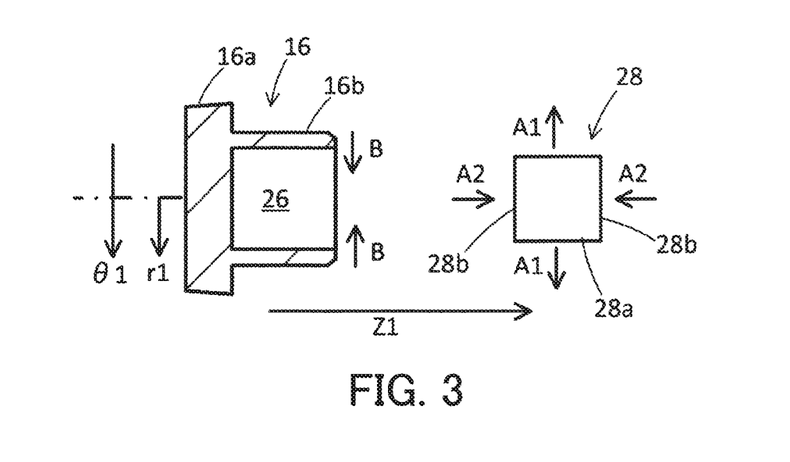
FIG. 3 is a sectional view showing a bottom cap and the insert member.

Hereinafter, the bottom cap 16 and the insert member 28 will be described in more detail with reference to FIG. 3. FIG. 3 is a sectional view showing the bottom cap 16 and the insert member 28.

The bottom cap 16 has a base portion 16a, and a thin wall portion 16b that protrudes from the base portion 16a. The thin wall portion 16b has, for example, a cylindrical shape, and the recess portion 26 is formed on an inner side of the thin wall portion 16b. For example, when a force is applied inwardly from the outside of the thin wall portion 16b along the radial direction r1, the thin wall portion 16b is bent inwardly (in a direction of arrows B), and when the force is not applied to the thin wall portion 16b, the thin wall portion 16b returns to a state before bent. The thin wall portion 16b has such an elastic force. For example, the thin wall portion 16b is bent inwardly, and in this state, the thin wall portion 16b is inserted in the other end 12b of the rotor 12. After being inserted, the thin wall portion 16b is to return to the state before bent (i.e., is to spread outwardly), and hence the thin wall portion 16b is pressed onto the inner peripheral surface of the rotor 12. Thus, the thin wall portion 16b is fitted into the other end 12b of the rotor 12 without generating any gaps. Even when an outer diameter of the thin wall portion 16b is slightly larger than an inner diameter of the rotor 12, the bottom cap 16 is fitted into the other end 12b by such an attachment operation as described above. The turbine cap 14 also has a configuration similar to that of the bottom cap 16, and the turbine cap is fitted into the one end 12a of the rotor 12 by an attachment operation similar to the attachment operation of the bottom cap 16.

The insert member 28 is disposed in the recess portion 26. The round pillar-shaped insert member 28 has the side surface 28a and the bottom surfaces 28b, and the insert member 28 is disposed in the recess portion 26 so that the side surface 28a of the insert member faces the thin wall portion 16b. That is, the insert member 28 is disposed in the recess portion 26 so that the axial direction Z1 of the rotor 12 and the axial direction Z2 of the insert member 28 are parallel to each other. Note that the axial direction Z1 and the axial direction Z2 do not have to be completely parallel to each other, and the side surface 28a of the insert member 28 may only face the thin wall portion 16b. Similarly, the insert member 28 is also disposed in the recess portion 26 formed in the turbine cap 14. Thus, the insert members 28 are arranged in the recess portions 24 and 26, respectively, so that the fiber material 30 is wound along the circumferential direction θ1 of the rotor 12.

Furthermore, a diameter of the insert member 28 (i.e., a width of the insert member 28 in the radial direction r2) is smaller than a diameter of the recess portion 26 (i.e., a width of the recess portion 26 in the radial direction r1). Therefore, the insert member 28 can be easily inserted in the recess portion 26 at room temperature (e.g., 300 K). Needless to say, when the insert member 28 can be pushed into the recess portion 26, the diameter of the insert member 28 may be equal to the diameter of the recess portion 26 or larger than the diameter of the recess portion 26.

In a state where the insert member 28 is inserted in the recess portion 26, the thin wall portion 16b of the bottom cap 16 is fitted into the other end 12b of the rotor 12. Similarly, in a state where the insert member 28 is inserted in the recess portion 24, the turbine cap 14 is fitted into the one end 12a of the rotor 12.

When the NMR sample tube 10 is cooled and a temperature of the NMR sample tube 10 drops, the bottom cap 16 having the positive linear expansion coefficient contracts in the direction of the arrows B (i.e., an inward direction) along the radial direction r1. When the insert member 28 is not disposed in the recess portion 26 of the bottom cap 16, a gap is formed between the inner peripheral surface of the rotor 12 and the thin wall portion 16b due to the contraction of the bottom cap, and the bottom cap 16 easily falls out from the rotor 12. This also applies to the turbine cap 14.

On the other hand, when the temperature of the NMR sample tube 10 drops, the insert member 28 having the negative linear expansion coefficient expands. Since the insert member 28 is disposed so that the side surface 28a of the insert member faces the thin wall portion 16b; i.e., the fiber material 30 is wound along the circumferential direction θ1, the insert member 28 expands toward the thin wall portion 16b. That is, the insert member 28 expands in the direction of the arrows A1 (i.e., an outward direction) along the radial direction r1. The contraction of the bottom cap 16 is inhibited by the expansion of this insert member, and gaps are unlikely to be formed between the inner peripheral surface of the rotor 12 and the thin wall portion 16b, so that the bottom cap 16 can be prevented from falling out from the rotor 12. This also applies to the turbine cap 14.

As described above, according to the first embodiment, even when the turbine cap 14 and the bottom cap 16 contract in accordance with the temperature drop, the contraction can be inhibited by the expansion of the insert members 28, and hence the turbine cap 14 and the bottom cap 16 can be prevented from falling outside. As a result, a temperature at which the NMR measurement is possible can be lowered differently from a case where the insert members 28 are not used. For example, the NMR measurement can be performed at a temperature of 20 K or less.

Furthermore, the insert member 28 is the round pillar-shaped or cylindrical member (e.g., a mass member), and the thin wall portion 16b is a thin member. Therefore, even when the insert member 28 is pushed inwardly from the outside due to the contraction of the thin wall portion 16b, the expansion of the insert member 28 surpasses the contraction of the thin wall portion 16b, and the insert member 28 does not contract, thereby inhibiting the contraction of the thin wall portion 16b. Furthermore, the thin wall portion 16b can be pushed outwardly due to the expansion of the insert member 28, depending on a thickness of the thin wall portion 16b and the size of the insert member 28. In this case, the thin wall portion 16b is pushed onto the inner peripheral surface of the rotor 12 by the insert member 28, and sealability of the bottom cap 16 increases. This also applies to the turbine cap 14.

After the NMR measurement, the temperature of the NMR sample tube 10 is returned to room temperature. Thermal deformation of the insert member 28 is reversible, and hence at room temperature, the insert member 28 returns to an original size (i.e., the size at room temperature prior to cooling). Therefore, the turbine cap 14 and the bottom cap 16 can be removed from the rotor 12 with the same force as in a case where the insert members 28 are not used. Thus, according to the NMR sample tube 10, the turbine cap 14 and the bottom cap 16 are easily attached and detached. Consequently, the sample can be easily replaced. Furthermore, reusability of the turbine cap 14 and bottom cap 16 increases.

Note that the insert members 28 may be removed from the recess portions 24 and 26 or do not have to be removed.

(Modification 1)

Figure 4:
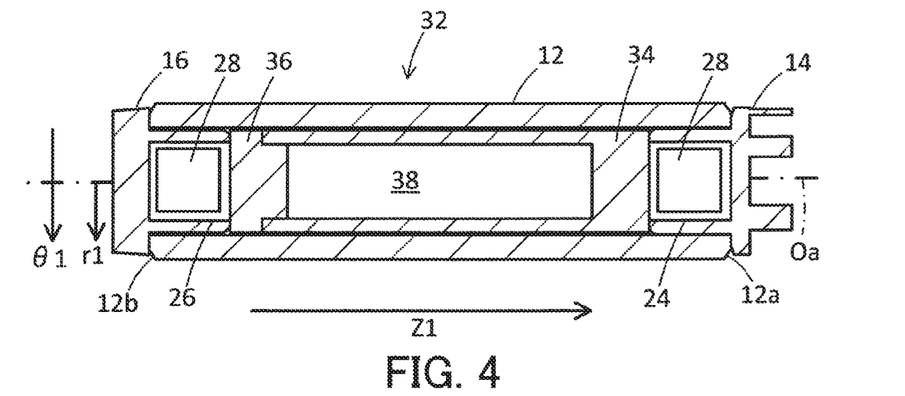
FIG. 4 is a sectional view showing an NMR sample tube according to Modification 1.

Hereinafter, Modification 1 of the first embodiment will be described with reference to FIG. 4. FIG. 4 is a sectional view showing an NMR sample tube according to Modification 1. A liquid sample is contained in an NMR sample tube 32 according to Modification 1 at room temperature. The NMR sample tube 32 includes a rotor 12, a turbine cap 14, and a bottom cap 16 in the same manner as in the NMR sample tube 10 described above. Furthermore, insert members 28 are disposed in a recess portion 24 of the turbine cap 14 and a recess portion 26 of the bottom cap 16, respectively.

In the rotor 12 of the NMR sample tube 32, a sample container 34 and a cap 36 are arranged. The sample container 34 is a cylindrical container having one end that is opened and the other end that is closed. The cap 36 is fitted into the one end. The sample container 34 and the cap 36 constitute an enclosed container for the liquid sample. The liquid sample is enclosed in a space 38 of the sample container 34 at room temperature.

Also in Modification 1, similarly to the above described first embodiment, even when the turbine cap 14 and the bottom cap 16 contract in accordance with temperature drop, the contraction can be inhibited by expansion of the insert members 28. Consequently, the turbine cap 14 and the bottom cap 16 can be prevented from falling outside.

As the liquid sample, for example, a sample that coagulates in accordance with the temperature drop is used. For example, the sample may have properties of a liquid at room temperature, may have properties of a solid at low temperature, or may have properties between the solid and the liquid at the low temperature.

(Modification 2)

In Modification 2, a sample having properties of a liquid at room temperature is contained in an NMR sample tube 10 shown in FIG. 1, without using a sample container 34 and a cap 36. A fiber material constituting an insert member 28 has properties to easily absorb the liquid. When the sample container 34 and the cap 36 are not used, the sample having the properties of the liquid may be absorbed by the insert member 28. To prevent this possibility, the insert member 28 according to Modification 2 is coated with a resin. Consequently, the absorption of the liquid sample by the insert member 28 is prevented.

Second Embodiment

Figure 5:
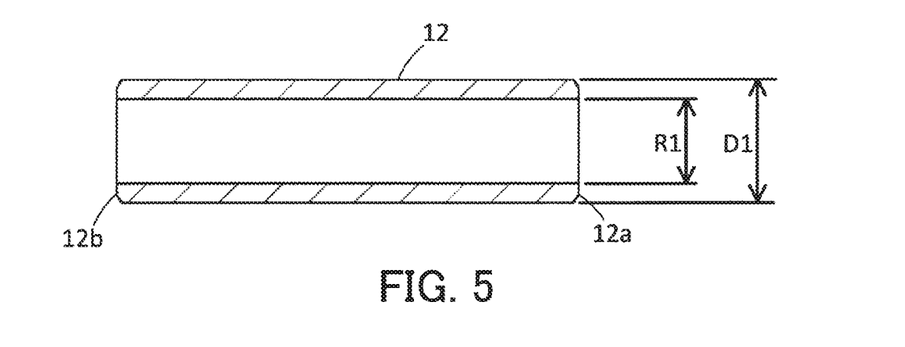
FIG. 5 is a sectional view showing a rotor.
Figure 6:
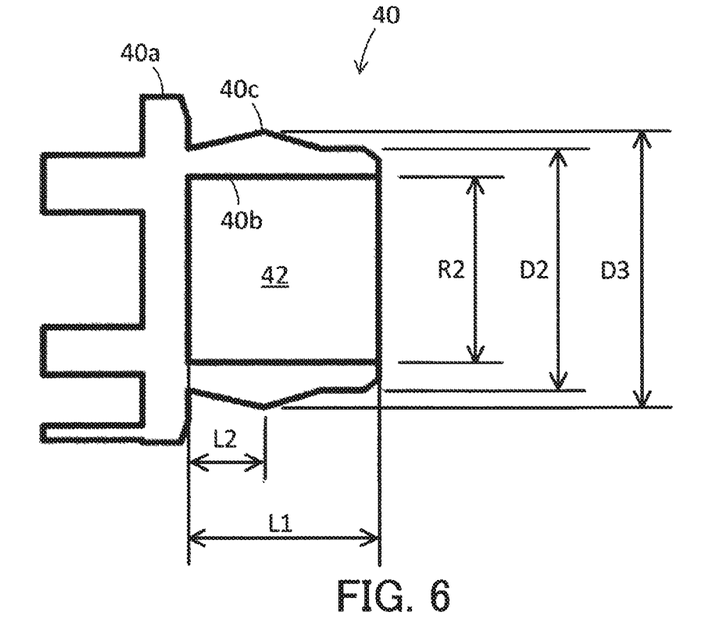
FIG. 6 is a sectional view showing a turbine cap according to a second embodiment.
Figure 7:
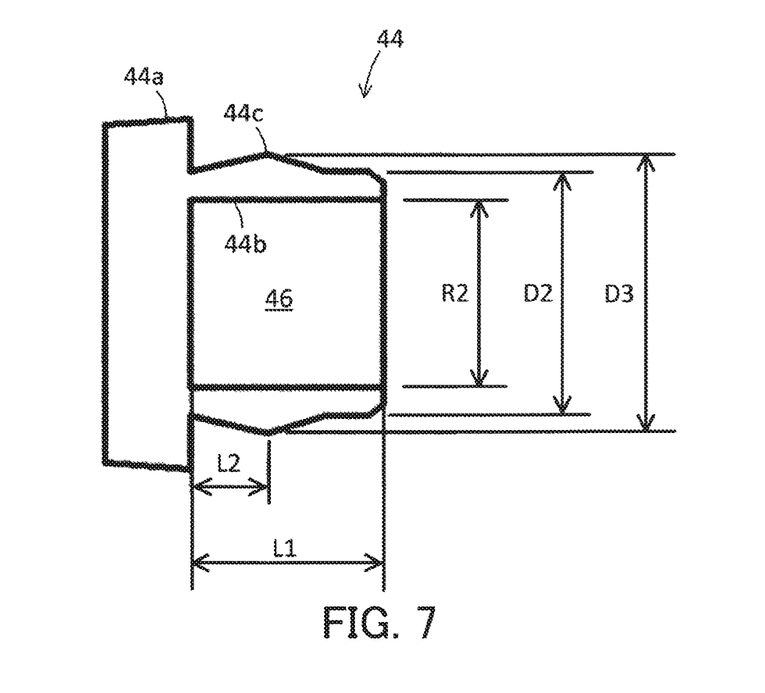
FIG. 7 is a sectional view showing a bottom cap according to the second embodiment.
Figure 8:
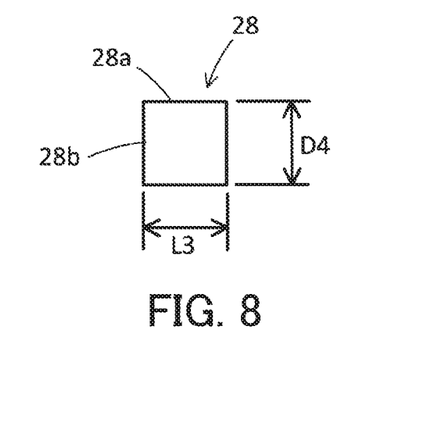
FIG. 8 is a sectional view showing an insert member.

Hereinafter, description will be made as to an NMR sample tube according to a second embodiment with reference to FIG. 5 to FIG. 8. FIG. 5 is a sectional view showing a rotor. FIG. 6 is a sectional view showing a turbine cap according to a second embodiment. FIG. 7 is a sectional view showing a bottom cap according to the second embodiment. FIG. 8 is a sectional view showing an insert member. As shown in FIG. 5, a rotor 12 according to the second embodiment has the same configuration as in the rotor 12 according to the first embodiment. Furthermore, as shown in FIG. 8, an insert member 28 according to the second embodiment has the same configuration as that of the insert member 28 according to the first embodiment. Furthermore, materials of respective components are the same as the materials of the respective components according to the first embodiment.

A turbine cap 40 according to the second embodiment will be described in detail with reference to FIG. 6. The turbine cap 40 includes a base portion 40a, and a thin wall portion 40b that protrudes from the base portion 40a. The thin wall portion 40b has a substantially cylindrical shape, and a recess portion 42 is formed on an inner side of the thin wall portion 40b. Furthermore, a circumferential surface 40c of the thin wall portion 40b protrudes toward an outer side. For example, on the basis of a direction perpendicular to the base portion 40a, the circumferential surface 40c tilts toward the outer side of the thin wall portion 40b as being away from the base portion 40a. Then, from a middle of the thin wall portion, the circumferential surface tilts toward the inner side, and at a subsequent position of the thin wall portion, the circumferential surface extends perpendicularly to the base portion 40a. Note that an impeller is formed in the turbine cap 40 in the same manner as in the turbine cap 14 according to the first embodiment.

A bottom cap 44 according to the second embodiment will be described in detail with reference to FIG. 7. The bottom cap 44 includes a base portion 44a, and a thin wall portion 44b that protrudes from the base portion 44a. The thin wall portion 44b has a substantially cylindrical shape, and a recess portion 46 is formed on an inner side of the thin wall portion 44b. Furthermore, a circumferential surface 44c of the thin wall portion 44b protrudes toward an outer side. For example, on the basis of a direction perpendicular to the base portion 44a, the circumferential surface 44c tilts toward the outer side of the thin wall portion 44b as being away from the base portion 44a. Then, from a middle of the thin wall portion, the circumferential surface tilts toward the inner side, and at a subsequent position of the thin wall portion, the circumferential surface extends perpendicularly to the base portion 44a.

Here, sizes of respective components will be defined. As shown in FIG. 5, an inner diameter R1 is an inner diameter of the rotor 12. An outer diameter D1 is an outer diameter of the rotor 12.

As shown in FIG. 6, an inner diameter R2 is an inner diameter of the thin wall portion 40b; that is, a width of the recess portion 42 in a radial direction r1. Outer diameters D2 and D3 indicate an outer diameter of the thin wall portion 40b. The outer diameter D2 is an outer diameter of a portion of the circumferential surface 40c which does not protrude toward the outer side. The outer diameter D3 is an outer diameter of a most protruding portion of the circumferential surface 40c. A length L1 corresponds to an overall height of the thin wall portion 40b on the basis of the base portion 40a. The length L1 corresponds to a depth of the recess portion 42. A length L2 corresponds to a distance from the base portion 40a to the furthest protruding portion of the circumferential surface 40c.

As shown in FIG. 7, an inner diameter R2 is an inner diameter of the thin wall portion 44b; that is, a width of the recess portion 46 in the radial direction r1. Outer diameters D2 and D3 indicate an outer diameter of the thin wall portion 44b. The outer diameter D2 is an outer diameter of a portion of the circumferential surface 44c which does not protrude toward the outer side. The outer diameter D3 is an outer diameter of a furthest protruding portion of the circumferential surface 44c. A length L1 corresponds to an overall height of the thin wall portion 44b on the basis of the base portion 44a. Furthermore, the length L1 corresponds to a depth of the recess portion 46. A length L2 corresponds to a distance from the base portion 44a to the furthest protruding portion of the circumferential surface 44c.

As shown in FIG. 8, a diameter D4 is a diameter of the round pillar-shaped insert member 28; that is, a width of the insert member in a radial direction r2. A length L3 is a height of the insert member 28; that is, a width of the insert member in an axial direction Z2.

An example of the size of each component will be described as follows.
Outer diameter D1: 3.20 mm
Outer diameter D2: 2.19 mm
Outer diameter D3: from 2.23 to 2.26 mm
Diameter D4: 1.60 mm
Inner diameter R1: 2.21 mm
Inner diameter R2: 1.60 mm
Length L1: 2.5 mm
Length L2: 1.0 mm
Length L3: 2.4 mm The outer diameter D3 of the turbine cap 40 and the bottom cap 44 may be larger than the inner diameter R1 of the rotor 12. Also in this case, when the thin wall portions 40b and 44b are inwardly pushed and bent in the same manner as in the first embodiment, the turbine cap 40 and the bottom cap 44 can be fitted into the rotor 12.

Figure 9:
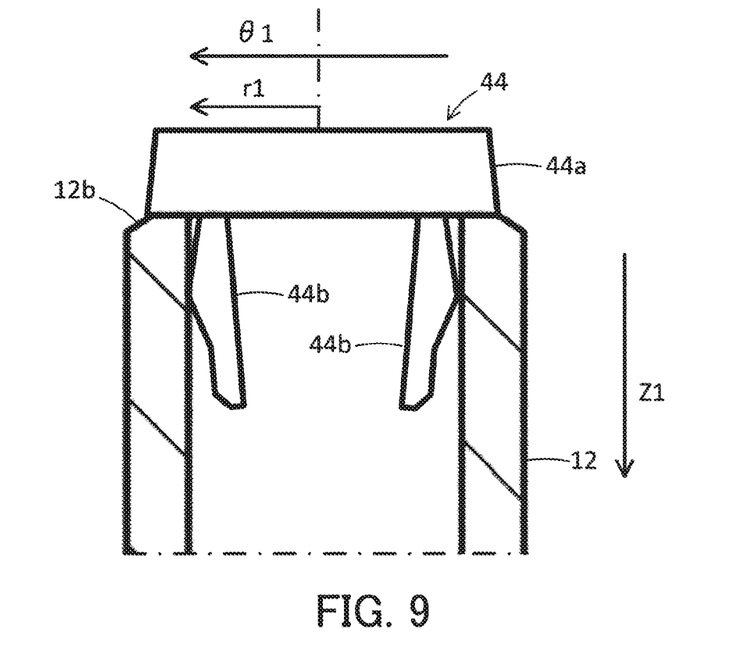
FIG. 9 is a sectional view showing a part of an NMR sample tube according to the second embodiment.

For example, as shown in FIG. 9, the thin wall portion 44b of the bottom cap 44 is pushed and bent inwardly, thereby inserting the bottom cap 44 in the other end 12b of the rotor 12. The thin wall portion 44b is to return to a state before bending (i.e., is to spread outwardly) in the rotor 12, so that the protruding portion of the thin wall portion 44b is pushed onto an inner peripheral surface of the rotor 12. Thus, the bottom cap 44 is fitted into the other end 12b of the rotor 12. That is, the circumferential surface 44c of the thin wall portion 44b which faces the inner peripheral surface of the rotor 12 has a shape that protrudes toward the inner peripheral surface of the rotor 12, and a protruding portion of the circumferential surface is pushed onto the inner peripheral surface of the rotor 12, thereby fitting the bottom cap 44 into the other end 12b of the rotor 12. The turbine cap 40 is also similarly inserted in one end 12a of the rotor 12, and a protruding portion of the thin wall portion 40b is pushed onto the inner peripheral surface of the rotor 12, thereby fitting the turbine cap 40 into the one end 12a of the rotor 12.

Figure 10:
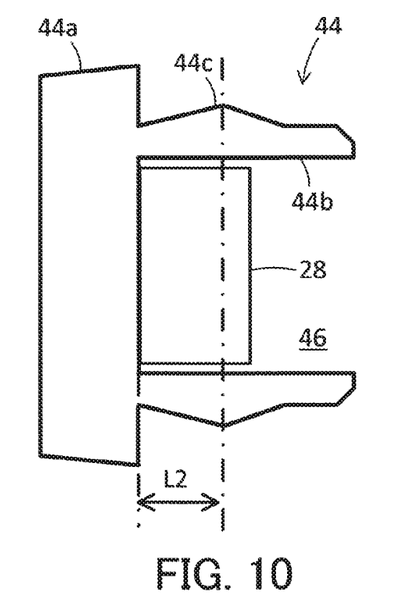
FIG. 10 is a sectional view showing the bottom cap and the insert member according to the second embodiment.

As shown in FIG. 10, the insert member 28 is disposed at a position corresponding to at least the furthest protruding portion of the circumferential surface 44c in the recess portion 46 of the bottom cap 44. For example, there is used the insert member 28 having the length L3 that is more than or equal to the length L2. When the insert member 28 having the length L3 is disposed in the recess portion 46, the insert member 28 is disposed at the position corresponding to the furthest protruding portion of the circumferential surface 44c.

Figure 11:
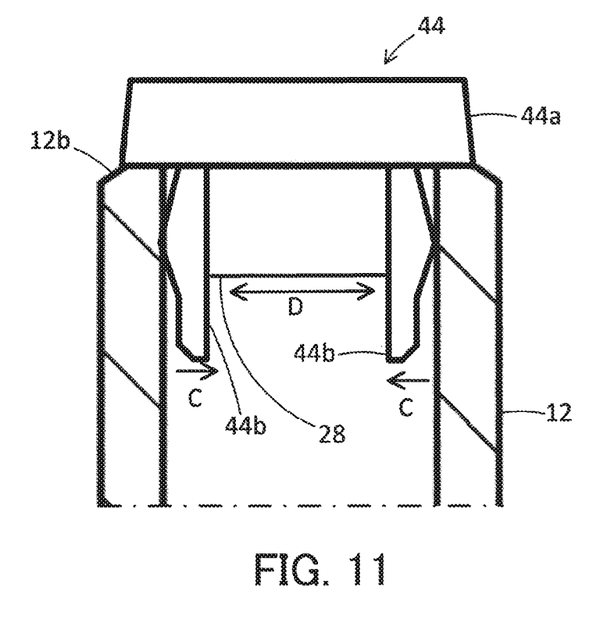
FIG. 11 is a sectional view showing a part of the NMR sample tube according to the second embodiment.

As shown in FIG. 11, even when the thin wall portion 44b contracts inwardly (i.e., in a direction of arrows C) in accordance with temperature drop, the insert member 28 expands outwardly (i.e., in a direction of arrows D), and pushes the thin wall portion 44b outwardly from inside. Thus, since the contraction of the thin wall portion 44b is inhibited, the furthest protruding portion of the thin wall portion 44b is pushed onto the inner peripheral surface of the rotor 12. As a result, the bottom cap 44 can be prevented from falling outside. This also applies to the turbine cap 40.

Figure 12:
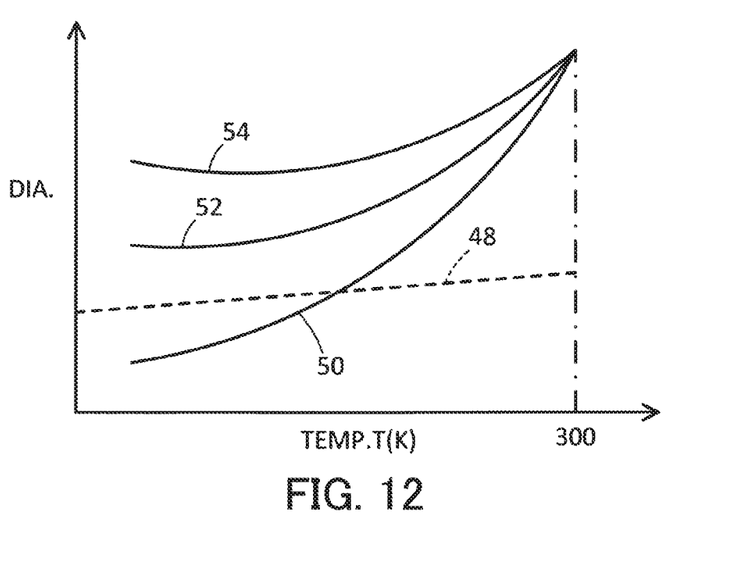
FIG. 12 is a graph showing relations of an inner diameter of the rotor and an outer diameter of the cap and a temperature.

Hereinafter, with reference to FIG. 12, description will be made as to a relation between the inner diameter R1 of the rotor 12 and the outer diameter D3 of the turbine cap 40 or the bottom cap 44. FIG. 12 shows a graph showing a qualitative relation between the inner diameter R1 and the outer diameter D3 due to temperature change. The horizontal indicates a temperature T(K), and the vertical indicates a size of the diameter.

A broken line 48 indicates the inner diameter R1 of the rotor 12. A solid line 50 indicates the outer diameter D3 when the insert member 28 is not used. Solid lines 52 and 54 indicate the outer diameter D3 when the insert member 28 is used. The rotor 12, the turbine cap 40, and the bottom cap 44 contract in accordance with the temperature drop. Therefore, as shown by the broken line 48, the inner diameter R1 decreases in accordance with the temperature drop. Furthermore, as shown by the solid lines 50, 52 and 54, the outer diameter D3 decreases in accordance with the temperature drop. When the insert member 28 is not used, the outer diameter D3 becomes smaller than inner diameter R1 as shown by the solid line 50, and as a result, the turbine cap 40 and the bottom cap 44 fall out from the rotor 12. On the other hand, when the insert member 28 is used, as shown by the solid lines 52 and 54, the outer diameter D3 is not smaller than the inner diameter R1, and as a result, the turbine cap 40 and the bottom cap 44 can be prevented from falling outside. Furthermore, as shown by the solid lines 52 and 54, a difference is made in change of the outer diameter D3, depending on a linear expansion coefficient of a fiber material for use in the insert member 28. For example, as shown by the solid line 54, the contraction of the outer diameter D3 is inhibited, and furthermore, the outer diameter D3 may expand in accordance with the temperature drop, depending on the linear expansion coefficient of the fiber material. In this case, a force to push the thin wall portions 40b and 44b onto the inner peripheral surface of the rotor 12 increases more, and hence the turbine cap 40 and the bottom cap 44 are less likely to fall outside.

Note that it is considered that a coefficient of friction between the inner peripheral surface of the rotor 12 and the thin wall portion 40b of the turbine cap 40 decreases in accordance with the temperature drop. Even when the outer diameter D3 is larger than the inner diameter R1, the turbine cap 40 may fall out from the rotor 12, due to friction between the inner peripheral surface of the rotor 12 and the thin wall portion 40b. Also in this case, the thin wall portion 40b is pushed onto the inner peripheral surface of the rotor 12 due to the expansion of the insert member 28. Consequently, the turbine cap 40 can be firmly fitted into the rotor 12, and the turbine cap 40 can be prevented from falling out from the rotor 12. This also applies to the bottom cap 44. Furthermore, this also applies to the NMR sample tube 10 according to the first embodiment.

Comparative Examples

Hereinafter, comparative examples to the first and second embodiments will be described.

Figure 13:
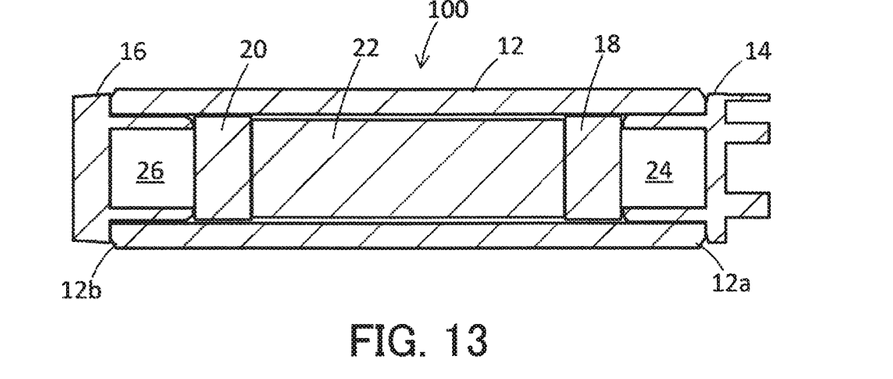
FIG. 13 is a sectional view showing an NMR sample tube according to Comparative Example 1.

FIG. 13 shows an NMR sample tube 100 according to Comparative Example 1. In the NMR sample tube 100, a recess portion 24 is formed in a turbine cap 14 and a recess portion 26 is formed in a bottom cap 16 in the same manner as in the NMR sample tube 10 according to the first embodiment. The recess portion 24 is formed to decrease a force for use when pressing the turbine cap 14 into a rotor 12. Similarly, the recess portion 26 is formed to decrease a force for use when pressing the bottom cap 16 into the rotor 12. The turbine cap 14 and the bottom cap 16 are members having a positive linear expansion coefficient. In Comparative Example 1, no insert members 28 are used. That is, the insert members 28 are not disposed in the recess portions 24 and 26. Therefore, the turbine cap 14 and the bottom cap 16 contract and fall out from the rotor 12 in accordance with temperature drop.

Figure 14:
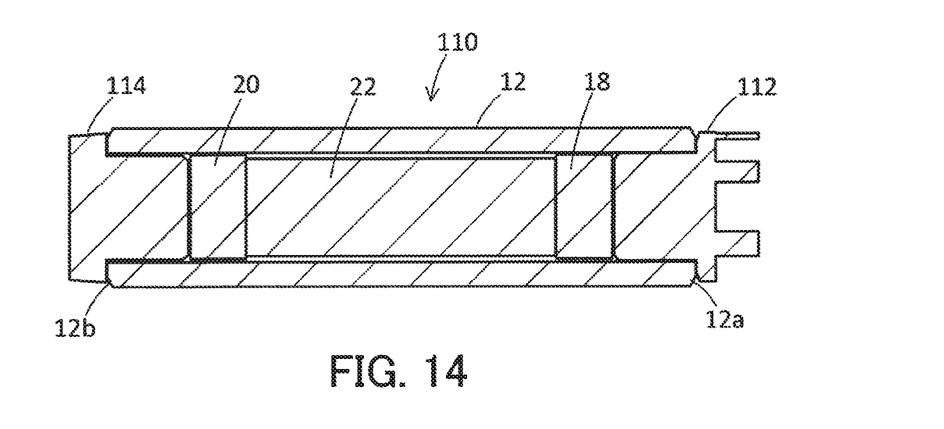
FIG. 14 is a sectional view showing an NMR sample tube according to Comparative Example 2.

FIG. 14 shows an NMR sample tube 110 according to Comparative Example 2. In Comparative Example 2, a turbine cap 112 is used in place of the turbine cap 14 and a bottom cap 114 is used in place of the bottom cap 16. Recess portions are not formed in the turbine cap 112 and the bottom cap 114. The turbine cap 112 and the bottom cap 114 are members having a positive linear expansion coefficient. Furthermore, in Comparative Example 2, insert members 28 are not used. Also in Comparative Example 2, the turbine cap 112 and the bottom cap 114 contract and fall out from a rotor 12 in accordance with temperature drop. Note that respective diameters of the turbine cap 112 and the bottom cap 114 are increased, so that the turbine cap 112 and the bottom cap 114 can be more firmly fitted into the rotor 12. However, the turbine cap 112 and the bottom cap 114 contract in accordance with the temperature drop, and hence the turbine cap 112 and the bottom cap 114 fall out from the rotor 12.

Figure 15:
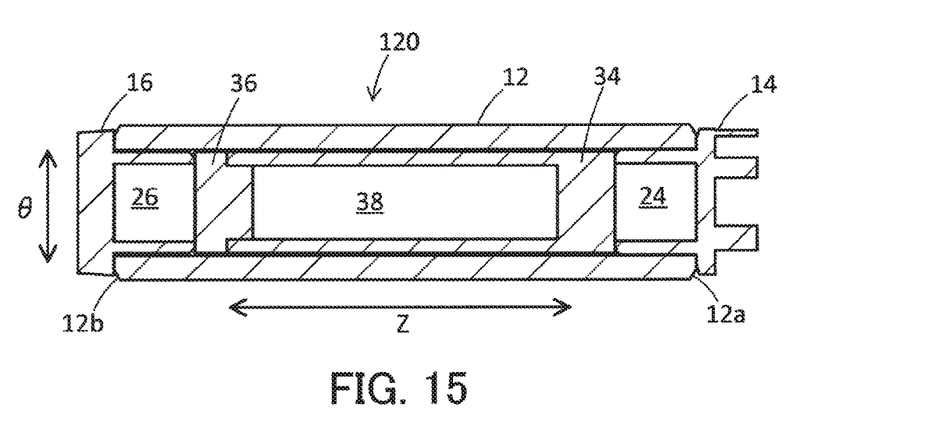
FIG. 15 is a sectional view showing an NMR sample tube according to Comparative Example 3.

FIG. 15 shows an NMR sample tube 120 according to Comparative Example 3. The NMR sample tube 120 according to Comparative Example 3 includes a sample container 34 and a cap 36 in the same manner as in the NMR sample tube 32 according to Modification 1. Furthermore, a recess portion 24 is formed in a turbine cap 14, and a recess portion 26 is formed in a bottom cap 16, but no insert members 28 are disposed in the recess portions 24 and 26. Therefore, the turbine cap 14 and the bottom cap 16 contract and fall out from a rotor 12 in accordance with temperature drop.

As described above, in Comparative Examples 1 to 3, since the insert members are not used, the turbine cap and the bottom cap fall out from the rotor, but the turbine cap and the bottom cap can be prevented from falling outside, when the insert members are used as in the first and second embodiments. According to the first and second embodiments, differently from Comparative Examples 1 to 3, the turbine cap and the bottom cap can be prevented from falling outside even at lower temperature, so that NMR measurement can be performed at the lower temperature. For example, the NMR measurement can be performed in a temperature range of 20 K or less.

The invention claimed is:

1. An NMR sample tube in which a sample of a target of NMR measurement is contained and which is rotated during the measurement, the NMR sample tube comprising:
    a main body having a tubular shape in which at least one end is opened, and containing the sample;
    a cap fitted into an opening of the end of the main body to close the opening of the end; and
    an insert member disposed in the cap and having a negative linear expansion coefficient,
    wherein the main body has a cylindrical shape,
    the insert member is a member formed by winding fibers having a negative linear expansion coefficient in a fiber direction in a form of a pillar along a circumferential direction of the main body, and
    the cap comprises a base portion and a thin wall portion that protrudes from the base portion, the thin wall portion having a cylindrical shape forming a recess portion on an inner side thereof in which the insert member is disposed.

2. The NMR sample tube according to claim 1, wherein the insert member is made of a fiber material coated with a resin.

3. The NMR sample tube according to claim 1, wherein the insert member is disposed in the cap so that the insert member expands toward an inner surface of the main body in accordance with temperature drop.

4. The NMR sample tube according to claim 1, wherein at least a part of a surface of the cap which faces an inner surface of the main body has a shape that protrudes toward the inner surface of the main body, and
    the insert member is disposed at a position corresponding to at least the protruding portion in the cap.

5. The NMR sample tube according to claim 1, wherein the cap has a positive linear expansion coefficient.

* * * * *